United States Patent [19]

Sheinberg

[11] 4,306,161
[45] Dec. 15, 1981

[54] SIMPLE METHOD OF SWITCHING AN AC LINE

[75] Inventor: David I. Sheinberg, Canton, Mass.

[73] Assignee: The United States of America as represented by the Secretary of the Army, Washington, D.C.

[21] Appl. No.: 50,250

[22] Filed: Jun. 20, 1979

[51] Int. Cl.³ .................... H03K 17/60; H03K 3/42
[52] U.S. Cl. .................... 307/255; 307/546; 307/311
[58] Field of Search .......... 307/254, 255, 279, 237, 307/360, 313, 249, 311, 551, 546, 547

[56] References Cited

U.S. PATENT DOCUMENTS

| | | | |
|---|---|---|---|
| 2,823,322 | 2/1958 | Trousdale | 307/249 |
| 2,938,174 | 5/1960 | Bulleyment | 307/255 |
| 4,064,407 | 12/1977 | Kelleher | 307/237 |
| 4,082,965 | 4/1978 | Horbeck et al. | 307/260 |
| 4,149,098 | 4/1979 | Wright | 307/255 |

Primary Examiner—Stanley D. Miller, Jr.
Assistant Examiner—B. P. Davis
Attorney, Agent, or Firm—Nathan Edelberg; Robert P. Gibson; Freddie M. Bush

[57] ABSTRACT

A switching circuit for an alternating current line allows the voltage or current coupled from the line to a load circuit to be controlled. Control may be in response to changes in voltage or current coupled as a feedback signal from the load to a switching circuit in the line for applying or terminating alternating current line voltages. In an alternative embodiment a switching circuit is initiated at the time alternating current voltages are applied to a load and after a predetermined time interval the switching circuit operates to disconnect and lock out the alternating current voltage.

9 Claims, 4 Drawing Figures

SIMPLE METHOD OF SWITCHING AN AC LINE

DEDICATORY CLAUSE

The invention described herein was made in the course of or under a contract or subcontract thereunder with the Government and may be manufactured, used, and licensed by or for the Government for governmental purposes without the payment to me of any royalties thereon.

BACKGROUND OF THE INVENTION

Most transisterized power supplies utilize silicon controlled rectifiers (SCR) switching in the alternating current (AC) line or a transistor as a series element to attain regulation. The SCR method requires the use of phase controls synchronous to the AC line to allow only the desired portion of the AC signal to pass. Because of this, fast rise times are experienced causing large transients in the output, also phasing controls can become quite complex. SCR's also have a forward voltage drop between 1.5 volts in low current devices to 3 volts in high current devices. The use of a series element usually has high power dissapation and limited range.

SUMMARY OF THE INVENTION

The switching circuit for an alternating current line includes complementary transistors coupled in an alternating current line in series with a load circuit. For a direct current load, after rectifying and filtering, a feedback path to a control switch allows the complementary transistors to be turned off and on in response to excessive voltage in the output load circuit. Alternatively, where the alternating current input is to be supplied to a load for a prescribed time and then terminated, a switching circuit in conjunction with a timing circuit is activated when voltage is applied to the load and terminates the voltage at a predetermined time.

DESCRIPTION OF THE PREFERRED EMBODIMENT

Figure 1:
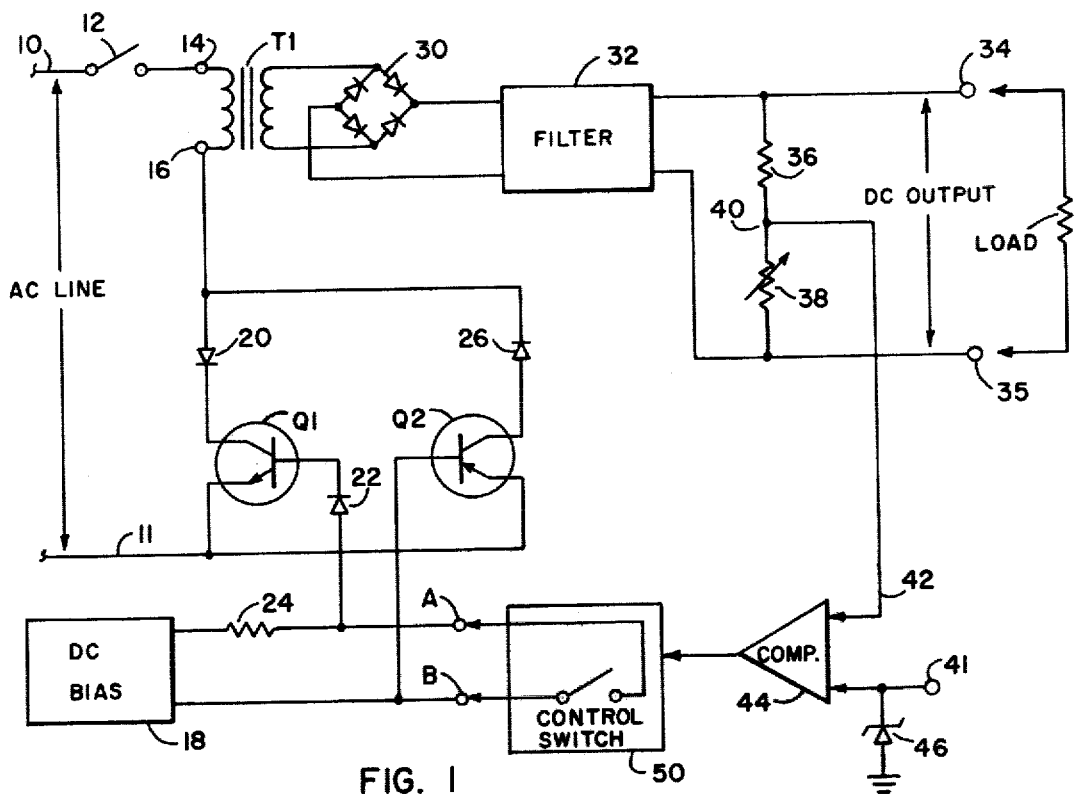
FIG. 1 is a partial schematic, partial block diagram of a preferred embodiment of the switching circuit for an alternating current line.

Referring now to the drawings wherein like numbers refer to like parts, FIG. 1 discloses a preferred embodiment of the invention. An alternating current (AC) line, leads 10 and 11, is adapted for coupling AC signals to a load circuit. Switch 12 allows line 10 to be coupled to one side 14 of the primary winding of a load transformer T1. The other primary winding terminal 16 is coupled through switching transistors Q1 and Q2 to AC lead 11. A direct current (DC) bias circuit 18 provides bias voltages for transistors Q1 and Q2. Transistor Q1 is an NPN transistor having the emitter coupled directly to lead 11 and the collector coupled in reverse direction through a diode 20 to terminal 16 of transformer T1. The base of Q1 is coupled in the reverse direction through a diode 22 and resister 24 to bias source 18. Q2 is a PNP transistor having the emitter coupled to lead 11, the collector coupled in the forward direction through a diode 26 to lead 16 of transformer T1 and the base directly coupled to bias source 18. The secondary of T1 is coupled through a bridge rectifier 30 and filter 32 to terminals 34 and 35 for supplying a DC output to load circuitry. A voltage sensing circuit comprised of series connected resistor 36 and variable resistor or potentiometer 38 is connected to the output of filter 32, across leads 34 and 35 for developing a feedback path for the switching circuits. Feedback from the variable resistor at point 40, shown typically as the junction between resistors 36 and 38, is coupled as an input 42 to comparator 44 for activating the switching circuit. Comparator 44 has a reference voltage input 41 for comparing with the input at 42. Zener diode 46 maintains reference voltage. The output of comparator 44 is coupled to a control switch for activating and deactivating the switch. Control switch 50 may be any of various conventional switching circuits whereby a switch is activated by an input signal to make or break a voltage or current path in a circuit. Control switch 50 is shown typically as a make-break mechanical switch coupled between junctions or terminals A and B of the circuit. Terminal A is connected to the junction of resistor 24 and the anode of diode 22, while terminal B is connected to the base of Q2.

Figure 2:
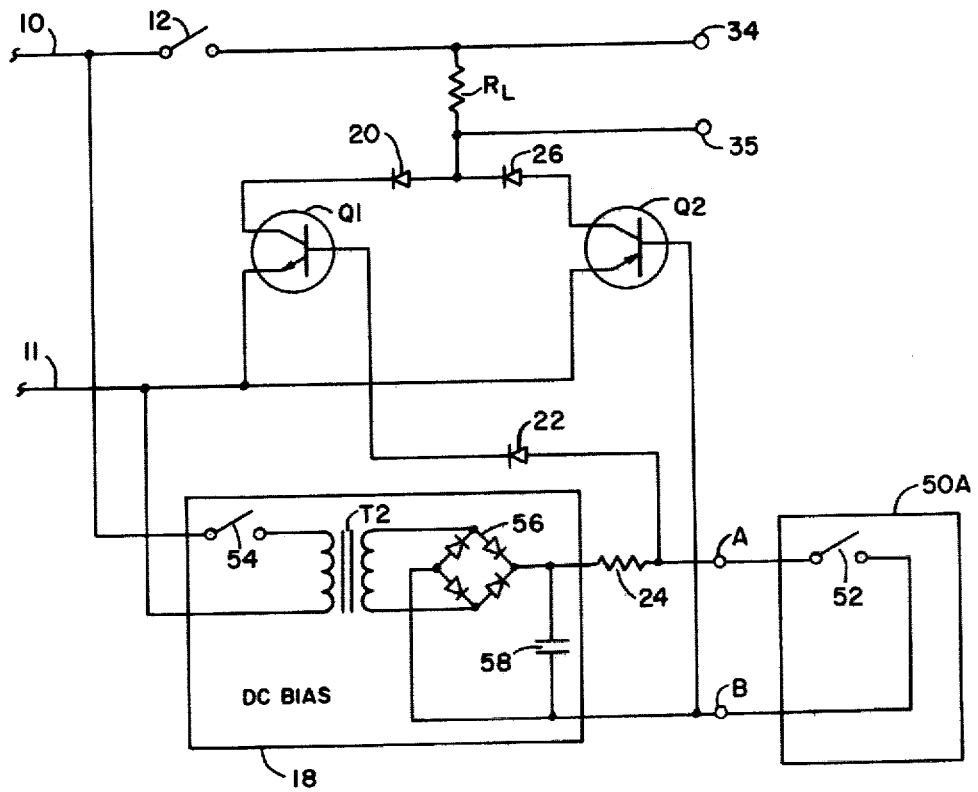
FIG. 2 is an alternative embodiment of a switching circuit.

FIG. 2 is an alternative embodiment to that of FIG. 1, the differences include control switch 50A being a manually operated switch 52 instead of a gated switch, a resistance load RL replaces transformer T1 and is coupled directly to output terminals 34 and 35. Resistance RL may be a resistance in parallel with the load circuit or may be symbolic of the load circuit itself. For this embodiment there is no voltage sensing circuit feeding back a gating signal. DC bias source 18 is shown in detail to be a transformer T2 having the primary connected through a switch 54 to the AC power input and the secondary of T2 being connected across a bridge rectifier 56 to provide a rectified DC voltage across capacitor 58 for supplying to the bases of Q1 and Q2.

Figure 3:
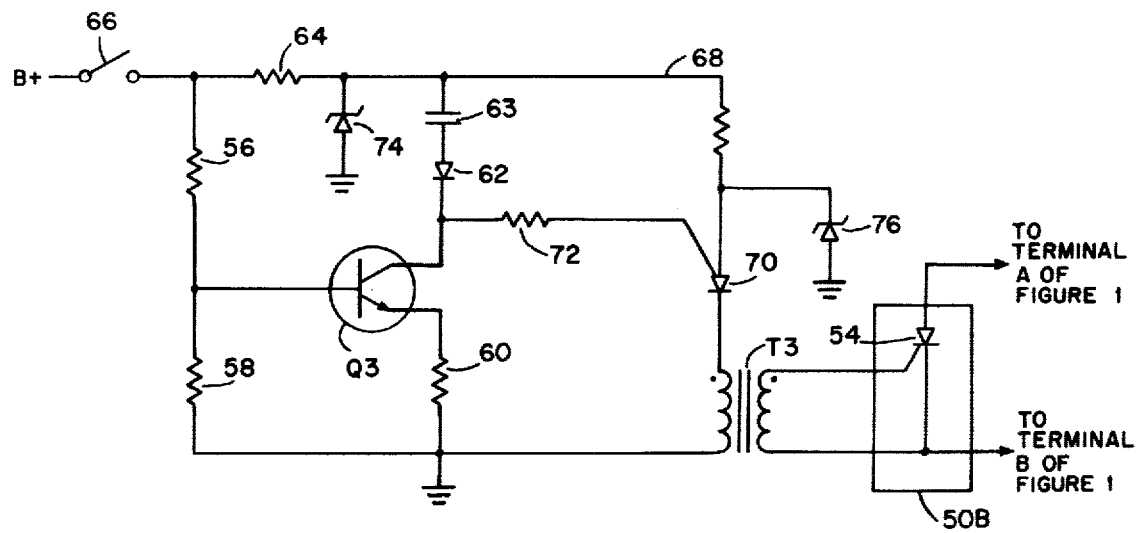
FIG. 3 is a volt-second timer and latching circuit for the switching circuits of FIGS. 1 and 2.

In the timer and latching circuit of FIG. 3, control switch 50B is shown to have a silicon controlled rectifier 54 therein having the anode and cathode thereof coupled respectively to terminals A and B of the circuitry of FIGS. 1 or 2. Rectifier 54 is gated by a cathode gate coupled to the secondary of a transformer T3 with the primary winding of T3 being coupled to the cathode of 54. To provide the timing, a transistor Q3 receives base biasing voltage from a voltage divider formed by resistors 56 and 58. The emitter of Q3 is coupled through a resistor 60 to a circuit common in conjunction with resistor 58 and one side of the primary winding of T3. The collector of Q3 is coupled in the reverse direction through a diode 62 and a capacitor 63 to a resistor 64 for receiving B+ through switch 66. B+ is further coupled through lead 68 to the anode of a silicon controlled rectifier 70. The cathode of SCR 70 is coupled to the other side of the primary of transformer T3, and an anode gate of SCR 70 is coupled through a resistor 72 to the collector of Q3. Zener diodes 74 and 76 provide voltage reference and over-voltage protection for the circuit.

Figure 4:
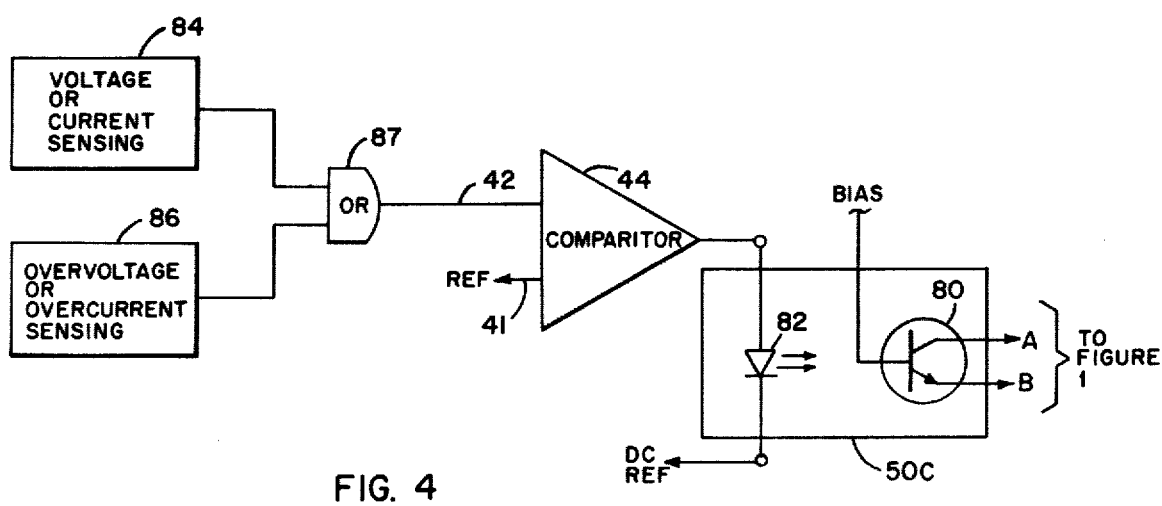
FIG. 4 is a voltage or current regulation control circuit having an optical leg between the control circuit and switching circuit.

FIG. 4 discloses control switch 50C coupled to terminals A and B to comprise a phototransistor 80 having the collector and the emitter thereof coupled respectively to terminals A and B and the base adapted for receiving bias voltage. Switch 50C further comprises a light emitting diode for emitting light in the direction of the phototransistor. This circuitry may be provided by an infrared LED and phototransistor coupled pairs such as the 4N25. The cathode of diode 82 is coupled to a DC reference voltage and the anode is coupled to receive the output from comparator 44 of FIG. 1. However, instead of only a voltage sensing circuit being coupled directly to the comparator 44 as shown in FIG. 1, FIG. 4 discloses a voltage or current sensing circuit 84 coupled as one input to an OR gate 87 and a typical over-voltage or over-current sensing circuit 86 coupled to the other input of OR gate 87 such that an input from either circuit will activate the OR gate providing an output to comparator 44 for activating the control switch.

During operation of the system of FIG. 1, a DC bias is simultaneously and continually applied directly to the base-to-emitter junction of PNP transistor Q2 and by way of resistor 24 and diode 22 to the base-to-emitter junction of NPN transistor Q1. Resistor 24, diode 22, and the base-to-emitter junctions of transistors Q1 and Q2 are in series, therefore the voltage measured between points A and B is very low, approximately 2.1 volts DC., being comprised of the voltage drops across the junctions of diode 20 and transistors Q1 and Q2. The biasing arrangement is effected to bias ON transistors Q1 and Q2. With T1 input terminal 14 being positive (during the positive half cycle of the AC signal being controlled) transistor Q1 conducts through diode 20 while diode 26 prevents transistor Q2 from conducting. When terminal 14 is negative, transistor Q2 conducts while diode 20 blocks conduction through Q1. Under these conditions current passes through the primary winding of transformer T1 and an AC signal will be provided on the secondary of the transformer. The resulting AC signal is rectified by the full wave rectifier and filtered to produce a DC output voltage to a load.

Control switch 50 between points A and B allows control of the bias applied to transistors Q1 and Q2 and therefore the DC output of the system. Control switch 50, shown as a single pole-single throw switch, may be a switching transistor or other gated switching means. When switch 50 is closed, the current passing through resistor 24 is shunted through the switch and transistors Q1 and Q2 will be biased off. Once the switch is open, transistors Q1 and Q2 will again be biased on.

Thus, when the DC output voltage developed across variable resistor 38 equals the reference voltage supplied to the comparator, the comparator 44 causes switch 50 to close thereby turning off transistor Q1 and Q2. Conversely, when the voltage across resistor 38 falls below the reference voltage, the comparator opens the switch and transistors Q1 and Q2 will be biased on. With resistor 38 being variable, the output DC voltage applied to the load is also variable.

The purpose of diode 22 is two-fold: it serves as a blocking diode to prevent the bias supply and the control switch from seeing the full AC input voltage should either transistor Q1 and Q2 short-circuit, and it insures that transistors Q1 and Q2 will be biased off when the control switch is closed.

In the alternative embodiment of FIG. 2 the voltage sensing feedback and comparator path is omitted. In this embodiment resistor RL is the load and replaces transformer T1, bridge 30, filter 32, and the sensing network. Manual switch 52 provides the control switch function of control switch 50A, being coupled to terminals or points A and B. The operation of the embodiment of FIG. 2 is therefore similar to that of FIG. 1, except the switching is manually or otherwise operated without direct response to a sensed voltage feedback.

FIGS. 3 and 4 disclose alternate embodiments of control circuits which may be used for purposes other than voltage regulation as shown in FIG. 1. Thus in using the control circuits of FIGS. 3 and 4 with the embodiments of FIGS. 1 or 2, the feedback path to control switch 50, as shown in FIG. 1, is replaced by the control circuit of FIG. 3 or FIG. 4. Where the AC or DC supply voltage is desired to be supplied for a given amount of time and then terminated or reduced, the circuit of FIGS. 1 and 3 are appropriate. Typically, a filament warm-up voltage may be required that would be twice the normal value for a prescribed time before the normal voltage is applied to the filament. In a missile system, this requirement may exist for a missile traveling wave tube and thereby allow the traveling wave tube to stabilize with pre-launch voltage prior to launch. The AC input voltage to FIG. 1 is applied simultaneously with the B+ for the circuit of FIG. 3. Transistor Q3 is biased on and current flow is through capacitor 63, charging the capacitor and developing voltage on the SCR70 gate. When the voltage to SCR 70 (2N6137) gate is of sufficient amplitude, the SCR fires creating a pulse through the pulse transformer, thereby firing SCR 54 (2N2329) and turning the control and latching circuit off until it is reset by being shut down and restarted. The requisite time delay is determined by the RC constant of the capacitor 63 and the resistor 60. For this application the anode of SCR 54 is connected to the A terminal while the cathode is connected to the B terminal.

The circuit of FIG. 4 in conjunction with FIG. 1 or FIG. 2 provides over-voltage or over-current control when connected to the A and B terminals. The voltage sensing circuit referred to in FIG. 4 is of the type shown in FIG. 1 for voltage regulation, or conventional current sensing would be utilized for current regulation. The over-voltage and/or over-current sensing is also of conventional design. For over-voltage or over-current protection, a sustained signal output would cause a shut down of the power supply to the load should these parameters be exceeded. By combining these sensing signals in a single OR gate, a single control mechanism is utilized to regulate and protect. Control switch 50C is an infrared light emitting diiode and phototransistor coupled pair forming an opto-isolator circuit and is responsive to the output to comparator 44, whereby light emitting from diode 82 activates transistor 80, causing switching action across points A and B. The opto-isolator of control switch 50C serves to provide isolation between an AC line and a DC output for high voltage situations.

With this switching system large transients on every half cycle are eliminated. Complex phasing circuitry is eliminated. Dissapations are greatly reduced because Vce saturation of transistors is low, ranging from 0.5 volts in low current devices to one volt in high current devices. Where silicon controlled rectfiers can only be turned off at the end of any one half cycle, this system can be turned off anywhere within the cycle. The use of the system allows for linear control of the switching devices, thereby allowing for current limiting line regulation and multiphase balancing. Thus, if the comparator of FIG. 4 is replaced by a linear operational amplifier, linear control, as opposed to switched control of transistors Q1 and Q2 is realized.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

I claim:

1. A switching circuit for an alternating current line comprising: first and second transistors having the emitters thereof connected together and adapted for coupling to one side of an alternating current line, first and second diodes coupled to the respective collectors of said first and second transistors, a load circuit having a first input adapted to be coupled to another side of said alternating current line and having a second input coupled respectively to the anode of said first diode and to the cathode of said second diode for developing an alternating current across said load circuit input; direct current bias means coupled to the respective bases of said first and second transistors; switch means coupled to the bases of said first and second transistors for short-circuiting bias signals applied to said bases when said switching means is closed; and wherein said first transistor is NPN, said second transistor is PNP, and said direct current bias means is output coupled directly to the base of said PNP transistor and is coupled through a resistor and a third diode to the base of said NPN transistor for providing a series connection between said transistors and said bias circuit.

2. A switching circuit as set forth in claim 1 and further comprising switch control means coupled to said switch means for operating said switch means.

3. A switching circuit as set forth in claim 2 wherein said load circuit has a direct current output, and said switch control means is further coupled to said direct current output and responsive to direct current changes for energizing and de-energizing said switch means.

4. A switching circuit as set forth in claim 3 wherein said switch control means comprises a resistance voltage divider responsive to said direct current output, and a comparator, said comparator having an input coupled to said voltage divider and an output coupled for operating said switch means.

5. A switching circuit as set forth in claim 4 wherein said load circuit comprises a transformer having an input primary coupled to receive said alternating current, a bridge rectifier coupled to the secondary of said transformer for providing a direct current output, filter means coupled to said rectifier for smoothing said direct current output for output coupling to a load; and said voltage divider being coupled across the output of said filter means.

6. A switching circuit as set forth in claim 5 wherein said switch means is a transistor.

7. A switching circuit as set forth in claim 5 wherein said switch means comprises a light emitting diode coupled to said comparator and responsive thereto for emitting light, and a phototransistor responsive to light from said diode to provide switching action.

8. A switching circuit as set forth in claim 2 wherein said switch means is a first silicon controlled rectifier, and said switch control means is a time delay circuit for activating said first silicon controlled rectifier.

9. A switching circuit as set forth in claim 8 wherein said time delay circuit comprises a third transistor adapted for receiving direct current supply and base bias voltages simultaneously, the collector of said third transistor being coupled in reverse through a diode and capacitor in series to said supply voltage and the emitter thereof being coupled through a first resistor to a circuit common, a second silicon controlled rectifier, a transformer having a primary coupled in series with said second silicon controlled rectifier across said supply voltage and circuit common and a secondary coupled between the gate and the cathode of said first silicon controlled rectifier for activating said rectifier; and said second silicon controlled rectifier having the gate thereof coupled to said third transistor collector for activating said second rectifier in response to the charging of said capacitor; said second silicon controlled rectifier being cathode coupled to said transformer primary.

* * * * *